United States Patent [19]
Okimoto et al.

[11] Patent Number: 5,825,694
[45] Date of Patent: Oct. 20, 1998

[54] SEMICONDUCTOR MEMORY DEVICE CAPABLE OF PREVENTING MALFUNCTION DUE TO DISCONNECTION OF COLUMN SELECT LINE OR WORD SELECT LINE

[75] Inventors: Hiromi Okimoto; Masanori Hayashikoshi; Youichi Tobita, all of Hyogo, Japan

[73] Assignee: Mitsubishi Denki Kabushiki Kaisha, Tokyo, Japan

[21] Appl. No.: 807,007

[22] Filed: Feb. 26, 1997

[30] Foreign Application Priority Data

Mar. 1, 1996 [JP] Japan .................................. 8-045255
Jul. 26, 1996 [JP] Japan .................................. 8-198204

[51] Int. Cl.$^6$ ............................................ G11C 7/00
[52] U.S. Cl. ............... 365/189.06; 365/200; 365/230.06
[58] Field of Search ................................ 365/63, 230.03, 365/230.06, 189.06, 200

[56] References Cited

U.S. PATENT DOCUMENTS

| | | | |
|---|---|---|---|
| 4,760,559 | 7/1988 | Hidaka et al. | 365/189.06 |
| 4,926,378 | 5/1990 | Uchida et al. | 365/63 |
| 4,970,685 | 11/1990 | Koyanagi | 365/63 |
| 5,161,121 | 11/1992 | Cho | 365/189.06 |
| 5,204,842 | 4/1993 | Umeki | 365/230.03 |
| 5,363,331 | 11/1994 | Matsui et al. | 365/230.03 |
| 5,406,526 | 4/1995 | Sugibayashi et al. | 365/63 |
| 5,465,233 | 11/1995 | Slemmer | 365/63 |
| 5,487,044 | 1/1996 | Kawaguchi et al. | 365/63 |

FOREIGN PATENT DOCUMENTS

| | | |
|---|---|---|
| 0107941 | 5/1984 | European Pat. Off. . |
| 0115127 | 8/1984 | European Pat. Off. . |
| 0160392 | 11/1985 | European Pat. Off. . |
| 02990870 | 1/1989 | European Pat. Off. . |
| 2191202 | 2/1974 | France . |
| 4434105 | 3/1995 | Germany . |
| 01081250 | 3/1989 | Japan . |
| 2-7286 | 1/1990 | Japan . |
| 4-17197 | 1/1992 | Japan . |
| 4-183000 | 6/1992 | Japan . |
| 5-210978 | 8/1993 | Japan . |
| 7-122098 | 5/1995 | Japan . |
| 21818948 | 4/1987 | United Kingdom . |

*Primary Examiner*—Vu A. Le
*Attorney, Agent, or Firm*—McDermott, Will & Emery

[57] ABSTRACT

A column select line includes a first layer column select line and a second layer column select line formed above the first layer column select line and connected thereto at any point. Furthermore, clamping circuits each for clamping each word line of paired main word lines at a constant potential are provided in a semiconductor memory device having main and secondary word line structure. With such a structure, malfunction due to multiselection of memory cells can be avoided even when the column select line or the paired main word lines is disconnected.

7 Claims, 5 Drawing Sheets

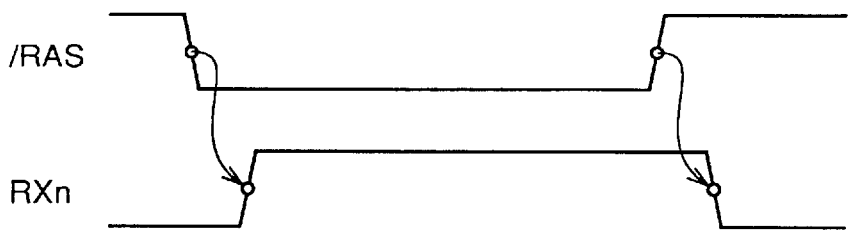
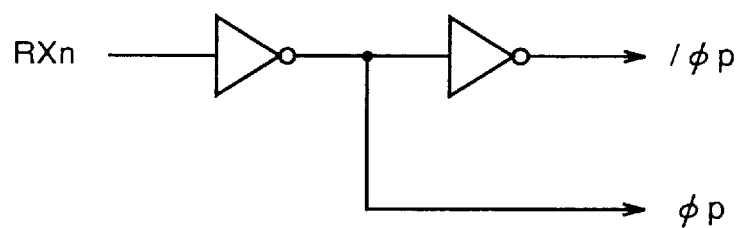

SEMICONDUCTOR MEMORY DEVICE CAPABLE OF PREVENTING MALFUNCTION DUE TO DISCONNECTION OF COLUMN SELECT LINE OR WORD SELECT LINE

BACKGROUND OF THE INVENTION

1. Field of the Invention

The present invention relates to a semiconductor memory device. It particularly relates to a column select line having a two layer structure and a clamping circuit which prevent malfunction when a column select line or a word line is disconnected by foreign matters or the like.

2. Description of the Background Art

FIG. 10 is a block diagram showing a configuration of a dynamic random access memory (referred to as a "DRAM" hereinafter), a conventional semiconductor memory device.

As shown in FIG. 10, the semiconductor memory device is provided with subarrays 1 into which a memory cell array is divided, a row decoder 2 arranged at each subarray 1 for selecting a word line WL, and a column decoder 3 arranged at each subarray 1 for selecting a column select line CSL.

Furthermore, the semiconductor memory device shown in FIG. 10 is a DRAM of ×4 configuration and has a memory cell array consisting of four subarrays 1. Each subarray 1 has a plurality of word lines WL including a redundant word line, a plurality of pairs of bit lines (not shown) arranged to cross the plurality of word lines WL and including a redundant pair of bit lines, a plurality of column select lines CSL arranged parallel to the plurality of pairs of bit lines and including a redundant column select line for sending a signal for selecting a pair of bit lines, and memory cells (not shown) connected to intersections of word lines WL and the pairs of bit lines.

One end of column select line CSL is connected to column decoder 3 and the other end is opened. Thus, when column select line CSL is disconnected due to foreign matters or the like, a redundant column select line is substituted for the column select line CSL while the disconnected portion is floating, causing multiselection of memory cells and hence malfunction of the device.

Furthermore, a word line WL also has one end connected to row decoder 2 while the other end open. Thus, when word line WL is disconnected due to foreign matters or the like, a redundant word line is substituted for the disconnected word line WL while the disconnected portion is floating, causing multiselection of memory cells and hence malfunction of the device.

SUMMARY OF THE INVENTION

An object of the present invention is to provide a semiconductor memory device free from malfunction even when a column select line or a word line is disconnected due to foreign matters or the like.

A semiconductor memory device according to one aspect of the present invention includes a plurality of column select lines, and a column decoder for selecting a column select line, the column select lines each including a first column select line and a second column select line connected to the first column select line at any point.

A semiconductor memory device according to another aspect of the present invention includes a plurality of column select lines, and a column decoder for selecting a column select line, the column select lines each including a first column select line and a second column select line arranged parallel to the first column select line and connected to the first column select line at any point.

A semiconductor memory device according to still another aspect of the present invention includes a plurality of word line pairs transmitting a complementary signal, a plurality of column select lines, a column decoder for selecting a column select line, a row decoder for selecting a pair of word lines, a plurality of first clamping circuits each connected to one word line of each pair of word lines, and a plurality of second clamping circuits each connected to the other word line of each pair of word lines, the first and second clamping circuits clamping corresponding word lines at a constant potential in response to an input control signal, respectively.

Therefore, an advantage of the present invention is that malfunction due to multisection of memory cells can be prevented even when a column select line is disconnected by foreign matters or the like.

Another advantage of the present invention is that in a semiconductor memory device having a layered word line structure, malfunction can be prevented even when a main word line pair is disconnected by foreign matters or the like.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 8A and 8B are timing charts illustrating a relation between a signal /RAS and signal RXn.

FIG. 9 is a circuit diagram showing a configuration of a circuit for generating signals $\phi p$ and $/\phi p$.

DESCRIPTION OF THE PREFERRED EMBODIMENTS (First Embodiment)

Figure 1:
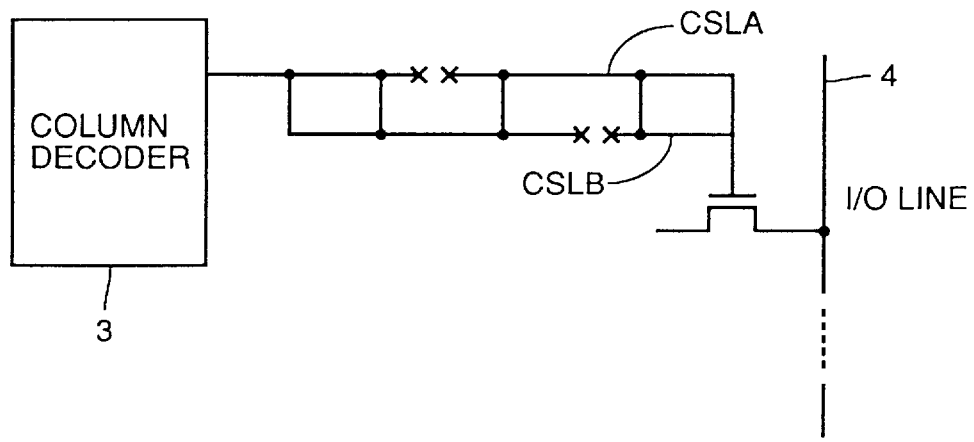
FIG. 1 shows a configuration of a semiconductor memory device according to a first embodiment of the present invention.

FIG. 1 shows a configuration of a semiconductor memory device according to a first embodiment of the present invention.

As shown in FIG. 1, the semiconductor memory device includes a column decoder 3, and a column select line connected to column decoder 3 and having a two aluminum layer structure. The column select line includes a first layer column select line CSLB and a second layer column select line CSLA connected to the first layer column select line CSLB at any point.

Figure 2:
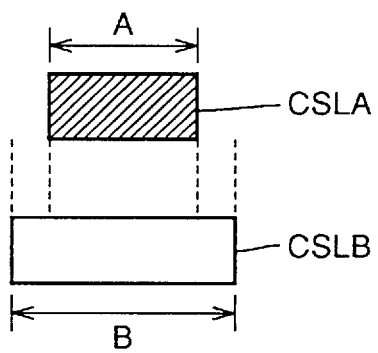
FIG. 2 shows a configuration in cross section of one example of the column select line shown in FIG. 1.

FIG. 2 is a cross sectional view of the column select line having a two layer structure shown in FIG. 1.

As shown in FIG. 2, the first and second layer column select lines CSLB and CSLA overlaps in the column select line having the two layer structure, and thus its parasitic capacitance is larger than that of a conventional column select line having a one layer structure. Thus, to minimize its parasitic capacitance, the second column layer select line CSLA is overlapped exactly above the first layer column select line CSLB and a width A of the second layer column select line CSLA does not exceed a width B of the first layer column select line CSLB.

Thus, even when one layer of the column select line is disconnected by foreign matters or the like, as shown in FIG. 1, the other layer of the column select line can substitute for the disconnected layer and thus multiselection of memory cells due to floating of a disconnected column select line can be avoided.

Figure 3:
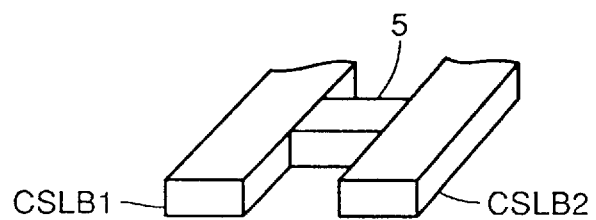
FIG. 3 shows another example of the configuration of the column select line shown in FIG. 1.

Other than the above two-layer structure, two column select lines CSLB1 and CSLB2 may be arranged in parallel and connected to each other by a connection 5 at any portion, as shown in FIG. 3.

Such a structure also allows one column select line CSLB1 or CSLB2 disconnected by foreign matters or the like to be substituted with the other column select line CSLB2 or CSLB1 and thus multiselection of memory cells due to floating of the disconnected column select line can be avoided.

It should be noted that the description above is not limited to examples in which the material of each of column select lines CSLA, CSLB, CSLB1 and CSLB2 is aluminum.

(Second Embodiment)

Figure 4:
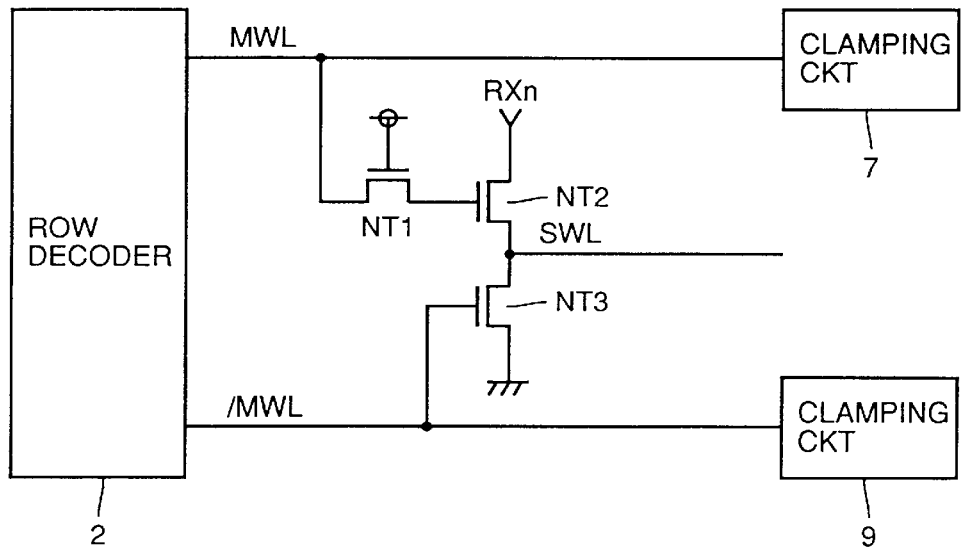
FIG. 4 shows a configuration of a semiconductor memory device according to a second embodiment of the present invention.

FIG. 4 shows a configuration of a semiconductor memory device according to a second embodiment of the present invention.

As shown in FIG. 4, the semiconductor memory device includes a main pair of word lines MWL and /MWL transmitting complementary signals, a row decoder 2 for selecting the main pair of word lines MWL and /MWL, a secondary word line SWL, a clamping circuit 7 for pulling down a main word line MWL to a ground potential, a clamping circuit 9 for pulling up a main word line /MWL to a power supply potential, and N channel MOS transistors NT1–NT3.

Figure 5:
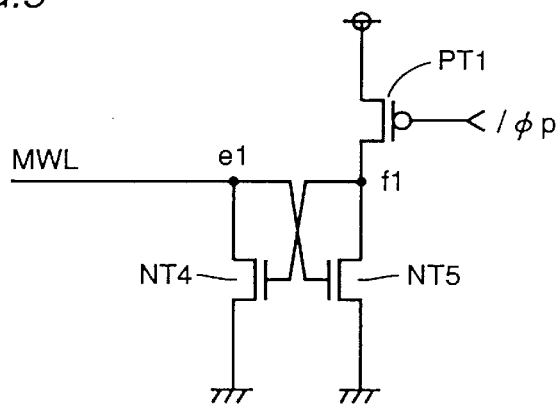
FIGS. 5 and 6 are circuit diagrams showing configurations of the clamping circuits shown in FIG. 4.

FIG. 5 is a circuit diagram showing a configuration of clamping cirucit 7. As shown in FIG. 5, clamping circuit 7 includes an N channel MOS transistor NT4 connected between main word line MWL and a ground node, an N channel MOS transistor NT5 connected between the gate of N channel MOS transistor NT4 and a ground node and having its gate connected to main word line MWL, and a p channel MOS transistor PT1 connected between the gate of N channel MOS transistor NT4 and a power supply node and having its gate receiving a signal /φp.

Figure 6:
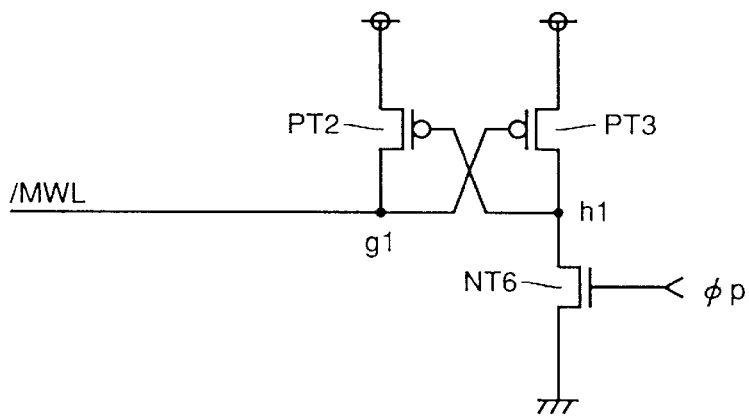

FIG. 6 is a circuit diagram showing a configuration of clamping circuit 9. As shown in Fig, 6, clamping circuit 9 includes a p channel MOS transistor PT2 connected between main word line /MWL and a power supply node, and a p channel MOS transistor PT3 connected between the gate of p channel MOS transistor PT2 and a power supply node and having its gate connected to main word line /MWL, and an N channel MOS transistor NT6 connected between the gate of p channel MOS transistor PT2 and a ground node and having its gate receiving a signal φp.

Figure 7:
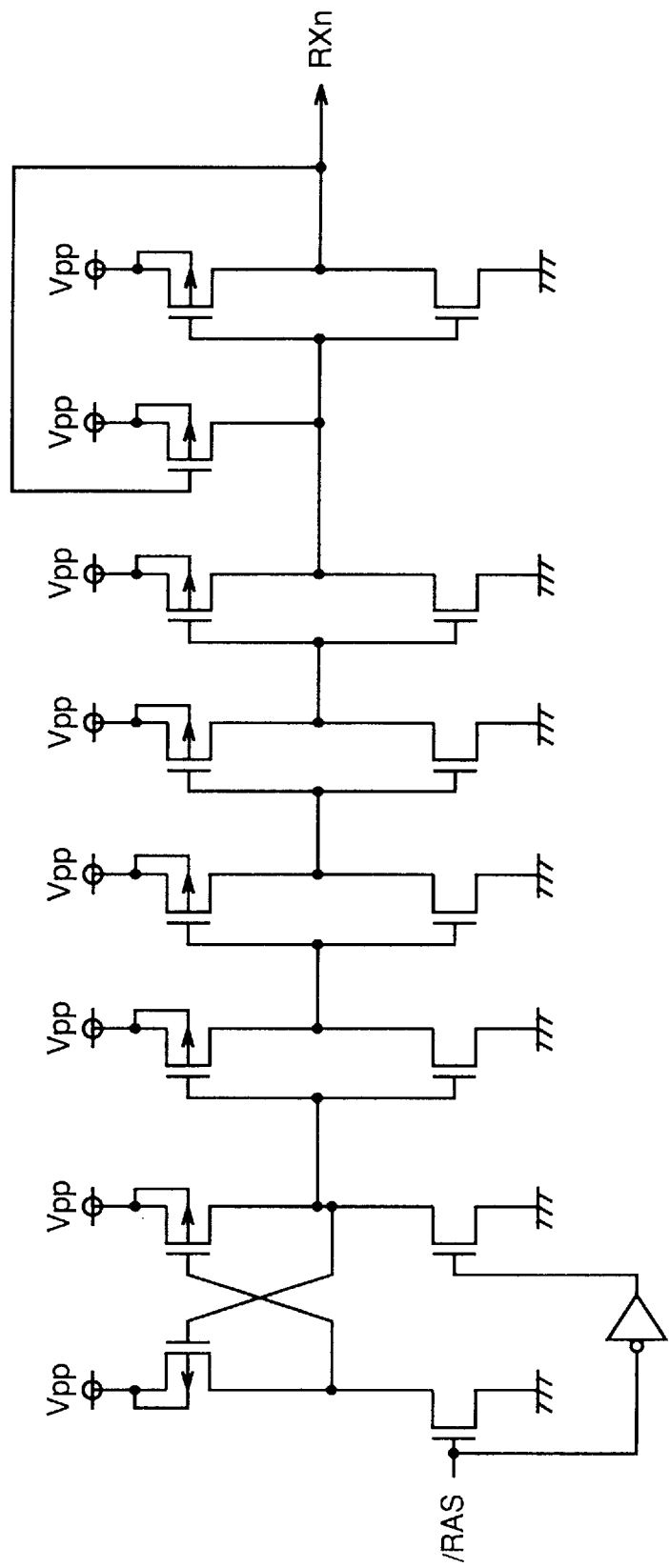
FIG. 7 is a circuit diagram showing a configuration of a circuit for generating a signal RXn.
Figure 10:
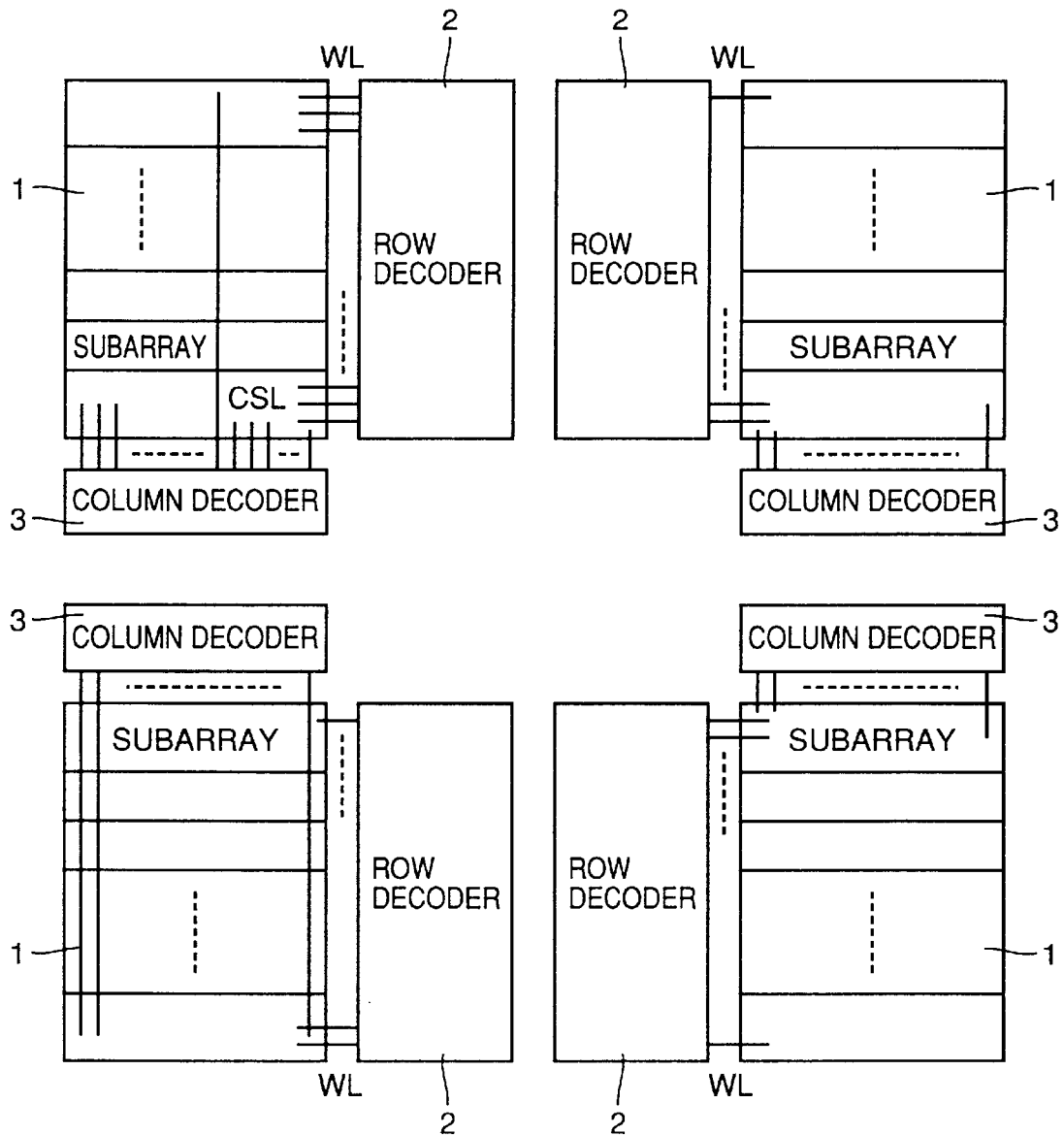
FIG. 10 shows a configuration of a conventional semiconductor memory device.

A signal RXn applied to the drain of n channel MOS transistor NT2 is generated from a signal /RAS, as shown in FIG. 7, and a relation between signal /RAS and signal RXn is illustrated in a timing chart shown in FIGS. 8A and 8B.

The signal /φp applied to the gate of p channel MOS transistor PT1 shown in FIG. 5 and the signal φp applied to the gate of N channel MOS transistor NT6 shown in FIG. 6 are complementary signals and generated from signal RXn, as shown in FIG. 9.

Furthermore it is difficult in manufacturing a semiconductor memory device having a main pair of word lines M and /MWL and a secondary word line SWL such as a semiconductor memory device according to the present embodiment to backline a word line formed of polysilicon with aluminum. Thus, clamping circuits 7 and 9 are provided at ends of paired main word lines MWL and /MWL opposite to row decoder 2, as shown in FIG. 4.

Operation of a semiconductor memory device according to the present embodiment will now be described.

When signal /φp input to the gate of p channel MOS transistor PT1 in clamping circuit 7 shown in FIG. 5 is activated (low level), p channel MOS transistor PT1 is turned on and the potential of a node f1 attains high level. This causes N channel MOS transistor NT4 to be turned on and the potential of a node e1 attains low level. Then, when signal /φp attains inactive high level, p channel MOS transistor PT1 is turned off and thus the potential of node e1 is held at low level.

Thus, main word line MWL is pulled down to low level.

On the other hand, while signal φp attains active high level in clamping circuit 9 shown in FIG. 6, N channel MOS transistor NT6 is turned on and the potential of a node h1 attains low level. This causes p channel MOS transistor PT2 to be turned on and the potential of a node g1 attains high level. Then, when signal φp attains inactive low level, n channel MOS transistor NT6 is turned off and thus the potential of node g1 is held at high level.

Thus, main word line /MWL is pulled up to high level.

The main word line /MWL pulled up to high level causes n channel MOS transistor NT3 shown in FIG. 4 to be turned on and thus secondary word line SWL is clamped at low level.

Thus, floating of paired main word lines MWL and /MWL can be avoided even when they are disconnected by foreign matters or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a plurality of word line pairs for transmitting complementary signals;

a row decoder for selecting said word line pairs;

a plurality of first clamping means each connected to one word line of each of said word line pairs; and a plurality of second clamping means each connected to the other word line of each of said word line pairs, wherein said first and second clamping means clamp corresponding said word lines at a constant potential in response to an input control signal, respectively.

2. A semiconductor memory device comprising:

a plurality of word line pairs for transmitting complementary signals;

a row decoder for selecting said word line pairs;

a plurality of first clamping means each connected to one word line of each of said word line pairs; and a plurality of second clamping means each connected to the other word line of each of said word line pairs, wherein said first and second clamping means clamp corresponding said word lines at a constant potential in response to an input control signal, respectively; and said control signal input to said first clamping means is a signal complementary to said control signal input to said second clamping means.

3. The semiconductor memory device according to claim 2, wherein each of said first clamping means includes:

a first transistor connected between said one word line and a ground node;

a second transistor connected between the gate of said first transistor and said ground node and having its gate connected to said one word line; and a third transistor connected between the gate of said first transistor and a power supply node.

4. The semiconductor memory device according to claim 3, wherein said third transistor is a p channel transistor.

5. The semiconductor memory device according to claim 3, wherein each of said second clamping means includes:

a fourth transistor connected between said other word line and said power supply node;

a fifth transistor connected between the gate of said fourth transistor and said power supply node and having its gate connected to said other word line; and a sixth transistor connected between the gate of said fourth transistor and said ground node.

6. The semiconductor memory device according to claim 5, wherein said sixth transistor is an n channel transistor.

7. The semiconductor memory device according to claim 5, wherein each of said first clamping means and said second clamping means is connected at an end of said word lines opposite to said row decoder.

* * * * *